United States Patent [19]

Liu et al.

[11] Patent Number: 5,177,439

[45] Date of Patent: Jan. 5, 1993

[54] PROBE CARD FOR TESTING UNENCAPSULATED SEMICONDUCTOR DEVICES

[75] Inventors: Jui-Hsiang Liu, Chandler; Dennis R. Olsen, Scottsdale, both of Ariz.

[73] Assignee: U.S. Philips Corporation, New York, N.Y.

[21] Appl. No.: 752,799

[22] Filed: Aug. 30, 1991

[51] Int. Cl.⁵ .......................... G01R 1/02; G01R 1/04
[52] U.S. Cl. ............................. 324/158 P; 324/72.5; 324/158 F
[58] Field of Search ............... 324/72.5, 158 P, 158 F; 156/647

[56] References Cited

U.S. PATENT DOCUMENTS

| | | | |
|---|---|---|---|
| 4,520,314 | 5/1985 | Asch et al. | 324/72.5 |
| 4,585,991 | 4/1986 | Reid et al. | 324/158 P |
| 4,764,723 | 8/1988 | Strid . | |
| 4,777,434 | 10/1988 | Miller et al. | 324/158 F |
| 4,799,009 | 1/1989 | Tada et al. | 324/158 F |
| 4,963,225 | 10/1990 | Lehman-Lamer | 324/158 P |
| 4,994,735 | 2/1991 | Leedy | 324/158 F |
| 5,027,062 | 6/1991 | Dugan et al. | 324/72.5 |
| 5,034,685 | 7/1991 | Leedy | 324/158 R |
| 5,061,894 | 10/1991 | Ikeda | 324/72.5 |
| 5,072,116 | 12/1991 | Kawade et al. | 324/158 P |

Primary Examiner—Ernest F. Karlsen
Assistant Examiner—William J. Burns
Attorney, Agent, or Firm—Robert J. Kraus

[57] ABSTRACT

A probe card (8,18) for testing unencapsulated semiconductor devices (7,17) wherein the probe card (8,18) is made from a semiconductor material (10). A plurality of pyramidally shaped conductive protrusions or probe tips (11,41) project from the surface of the probe card (8,18) to mate with electrode pads on an unencapsulated semiconductor device (7,17) to be tested. The probe tips (11,41) are formed using standard etch techniques, hence they can be configured to contact electrode pads that reside on the unencapsulated semiconductor device in either a peripheral or area array. Further, the probe card (8,18) is capable of testing integrated circuits in either wafer or die form.

4 Claims, 4 Drawing Sheets

PROBE CARD FOR TESTING UNENCAPSULATED SEMICONDUCTOR DEVICES

BACKGROUND OF THE INVENTION

This invention relates, in general, to fixtures for testing unencapsulated integrated circuits and, more specifically, to an interface probe card manufactured from semiconductor materials.

The manufacture of semiconductor integrated circuits entails a multitude of procedures including: design, process, packaging, and test. What is more, testing has been divided into functional, parametric and burn-in methodologies. In each of these regimes the devices may be tested in wafer, die or packaged form. And, although packaging is a comparatively expensive step, semiconductor manufacturers have packaged the devices prior to testing; hence, prior to ensuring proper device operation. Now, however, the high cost of packaging semiconductor devices, coupled with the increased complexity of the semiconductor device structures, requires that devices be tested in wafer or die form in order to decrease the probability of packaging nonoperational units. Further, with the advent of multichip modules, wafer or die level testing is required since the semiconductor device is only one of several components mounted on a multichip carrier.

A fixed probe board for testing semiconductor wafer chips was disclosed by Hasegawa in U.S. Pat. No. 4,563,640. The probe board comprises a multiplicity of probe needles mounted to a support base. The configuration of the probe needles matches an array of electrode pads spread around the periphery of the integrated circuit to be tested. Although this invention has provided a means for testing unencapsulated integrated circuits it had several drawbacks. First Hasegawa's fixed probe board is impractical for parallel testing more than four integrated circuits in die or wafer form. Second, semiconductor manufacturers have started to design integrated circuits with the array of electrode pads spread across the surface area (referred to as an area array) of the integrated circuit rather than around the periphery; this technique can not be used for large numbers of electrode pads configured in an area array. Third, the difference between the coefficients of thermal expansion of the probe board and the device under test may result in a high impedance contact between the probe needles and the electrode pads on the semiconductor device. In fact, the probe needles and device electrode pads may separate completely, forming an electrical "open." Finally, the probe needles are fragile and require frequent re-alignment.

B. Leslie and F. Matta, in their paper "Membrane Probe Card Technology," presented at the 1988 International Test Conference, addressed the limitations of conventional probe cards. Moreover, these researchers have described a probe card wherein the probe needles were replaced with contact bumps formed on a flexible dielectric membrane. Further, a microstrip transmission line, formed on one side of the membrane, connects test circuitry with the device under test. Since the conductor traces and the contact bump positions are obtained using photolithographic techniques, integrated circuits with electrode pads in either a peripheral or area array can be tested. Moreover, the relative positions of contact bumps and traces are defined by the photolithographic steps thereby, eliminating the need for any "re-alignment." In addition, the flexibility of the membrane allows contact with nonplanar surfaces as well as decreases damage to electrode pads on the device under test. Still, this technique did not eliminate the thermal mismatch inherent in using a probe card made from a different material than the device being tested. Accordingly, it would be beneficial to have a readily manufacturable interface probe card capable of reliably contacting electrode pads in either a peripheral or array configuration, and which has thermal properties similar to the device under test.

SUMMARY OF THE INVENTION

Briefly stated, the present invention has an interface probe card for testing unencapsulated semiconductor devices. The probe card is manufactured from a semiconductor substrate material. A plurality of protrusions is formed in the top surface of the substrate. Each protrusion is coated with a layer of conducting material. The protrusions are patterned to match either a peripheral or an area array of electrode pads on the device to be tested. Conductive interconnects couple each of the coated plurality of protrusions to an external test system.

DETAILED DESCRIPTION OF THE DRAWINGS

Figure 1:
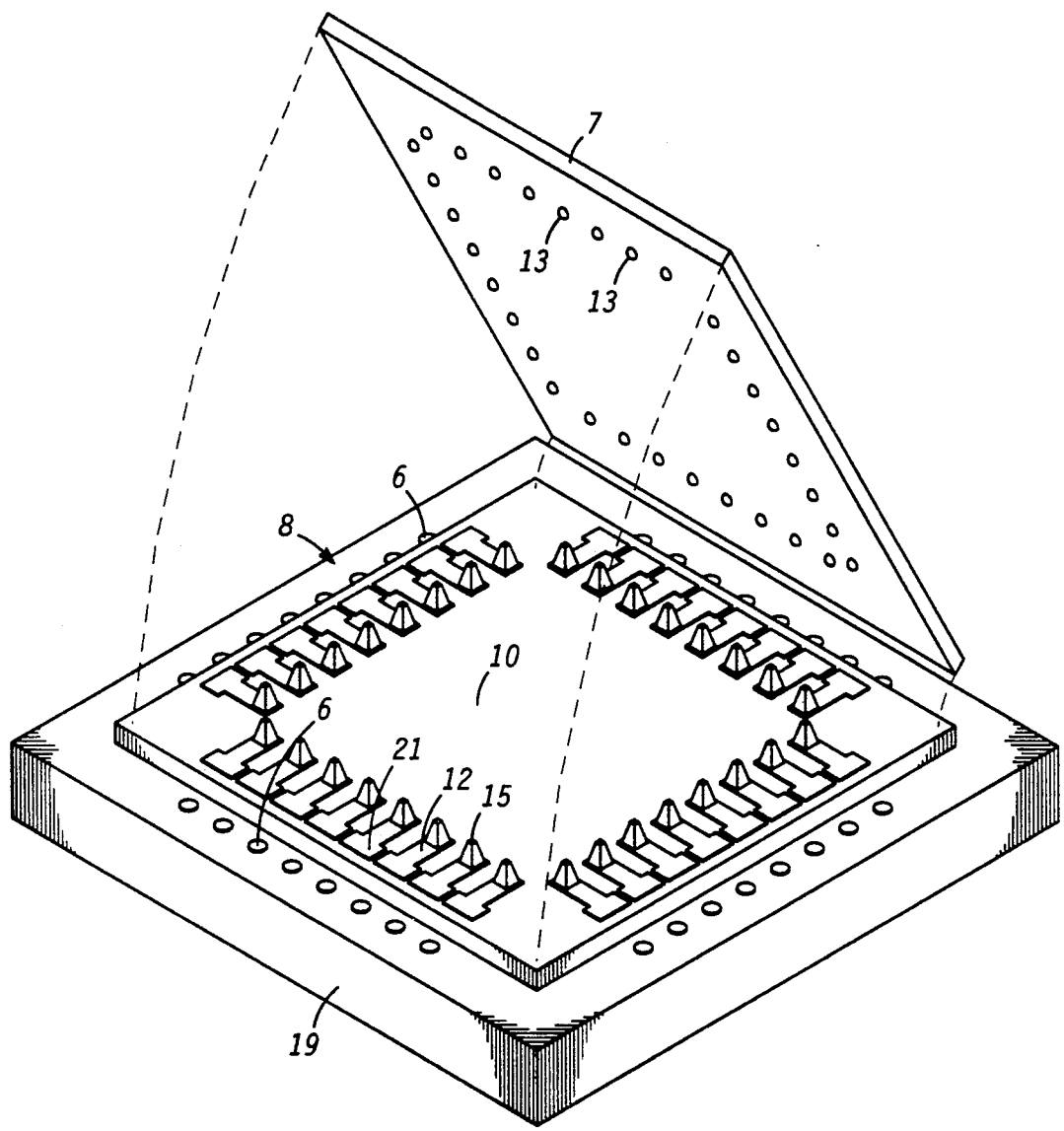
FIG. 1 is a pictorial representation of an isometric view of a peripheral array probe card in accordance with the present invention.

Illustrated in FIG. 1 is a probe card 8 with an array of probe tip contacts 15 patterned to mate with electrode pads or bumps 13 on an unencapsulated semiconductor device 7 to be tested, wherein probe tip contacts 15 are in a peripheral array configuration. Probe card 8 serves as a test interface structure for transmitting signals between external test circuitry (not shown) and an unencapsulated semiconductor device 7. Unencapsulated semiconductor device 7 may be in die or wafer form, and has a plurality of contacts 13 in a peripheral array configuration to mate with probe tip contacts 15. In a preferred embodiment, the substrate material for probe card 8 is a semiconductor material similar in chemical composition and crystal orientation to the substrate of unencapsulated semiconductor device 7. Since the coefficients of thermal expansion of probe card 8 and unencapsulated semiconductor device 7 match, probe card 8 is particularly suited for burn-in testing. Further, the perimeter of probe card 8 extends beyond the perimeter of unencapsulated semiconductor device 7. It will be understood that the present invention does not limit the type of substrate material for probe card 8. In other words the chemical composition and crystal orientation of the substrate material for probe card 8 may be different from those of unencapsulated semiconductor device 7.

Probe card 8 has a plurality of protrusions, covered by both a dielectric and a conductive material, projecting from its top surface; wherein the aforementioned combination is known as a probe tip contact 15. As illustrated, probe card 8 has a square shape comprising thirty two probe tip contacts 15 arranged with eight probe tip contacts 15 per side. Each probe tip contact 15 comprises a probe tip 11 (FIG. 2) which protrudes from the surface of a semiconductor material 10. A primary conductive material 12 extends from each probe tip contact 15 to separate bond pads 21.

Semiconductor material 10 is mounted to a support structure 19. Support structure 19 includes a plurality of conductive pads 6 which function as conductive interconnects for externally coupling to probe tip contacts 15. In a first embodiment, support structure 19 is a pin grid array package with conductive pads 6 wire bonded to bond pads 21. In a second embodiment, pin grid array package support structure 19 is tape automated bonded, commonly referred to as TAB bonding, to bond pads 21. In a third embodiment, support structure 19 is a pad grid array package with conductive pads 6 wire bonded to bond pads 21. In a fourth embodiment, bond pads 21 are electrically coupled to pad grid array package support structure 19 by TAB bonding. It is realized that the support structure 19 shown in FIG. 1 is a representation to encompass both pin grid array and pad grid array packages as is obvious to those skilled in the arts.

Conductive pads 6 route electrical signals to and from the semiconductor device 7 to be tested via probe card 8. It will be understood that probe card 8 is illustrated as an example only and not as a limitation to the present invention. In other words, the number of probe tip contacts 15 and the shape of probe card 8 is not limited by the examples given.

Figure 2:
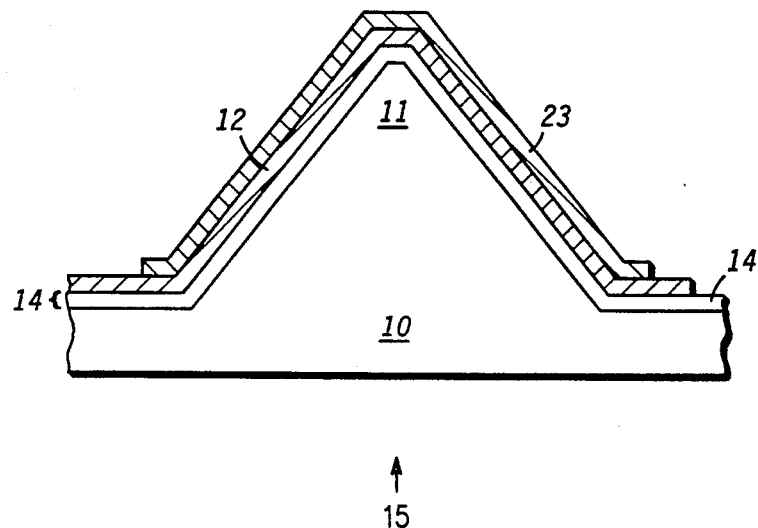
FIG. 2 is a cross-sectional side view of a probe tip illustrated in FIG. 1.

FIG. 2 is an enlarged cross-sectional side view of probe tip 11 including dielectric material 14, and primary and secondary conductive materials 12 and 23, respectively. Probe tip 11 including dielectric material 14, and conductive materials 12 and 23 is referred to as a probe tip contact 15.

The plurality of probe tip 11 positions are patterned using generally accepted photolithographic techniques which are well known in the semiconductor arts. Probe tips 11 are formed using an anisotropic or orientation dependent wet etch to etch semiconductor material 10. In a preferred embodiment, semiconductor material 10 is (1 0 0) silicon. Orientation dependent etching of (1 0 0) silicon forms pyramidal protrusions which are referred to as probe tips 11. Pyramidal probe tips 11 are the preferred structure because probe tips 11 are capable of penetrating any superficial oxide present on the electrode pads or bumps of the semiconductor device 7 (FIG. 1) to be tested. The top of probe tip 11 appears to be large and flat; however, it will be realized that FIG. 2 is an enlargement of an actual probe tip.

In addition, the pyramidal structure mitigates contact anomalies due to any nonplanar electrode pads or bumps 13, on the semiconductor device 7 to be tested. Typically, orientation dependent etching of (1 0 0) silicon is accomplished using an etchant comprising potassium hydroxide, normal propanol, and deionized water. In a preferred embodiment, the pyramidal structure has a height of approximately 15 micrometers and a base length of approximately 25 micrometers.

After formation of probe tips 11, a layer of dielectric material 14 is formed on the surface of semiconductor material 10 and probe tips 11. In a preferred embodiment, dielectric material 14 is silicon dioxide. In a further embodiment, the thickness of dielectric material 14 for burn-in testing is one micrometer.

Primary conductive material 12 is deposited over the dielectric material 14 covering probe tips 11, and further extends from each probe tip 11. Dielectric material 14 is sandwiched between primary conductive material 12 and semiconductor material 10; hence, dielectric material 14 electrically isolates primary conductive material 12 from semiconductor material 10. In a preferred embodiment, primary conductive material 12 is aluminum. In an alternate embodiment, primary conductive material 12 comprises a trilayer structure in which a layer of copper is sandwiched between two layers of chromium.

Probe tip 11 regions are coated with secondary conductive material 23. Secondary conductive material 23 provides a conductive coating over the primary conductive material 12 which itself covers the dielectric material 14 coating probe tips 11. In a preferred embodiment, secondary conductive material 23 comprises a four layer structure wherein the first layer is chromium, the second layer is copper, the third layer is nickel and the fourth or top layer is gold. In an alternate embodiment, secondary conductive material 23 is a three layer structure wherein the first layer is aluminum, the second layer is titanium, and the third or top layer is gold. It will be understood that primary conductive material 12 and secondary conductive material 23 are not limitations to the present invention. In other words, the types of materials for primary conductive material 12 and secondary conductive material 23 are not limited by the examples given.

Figure 3:
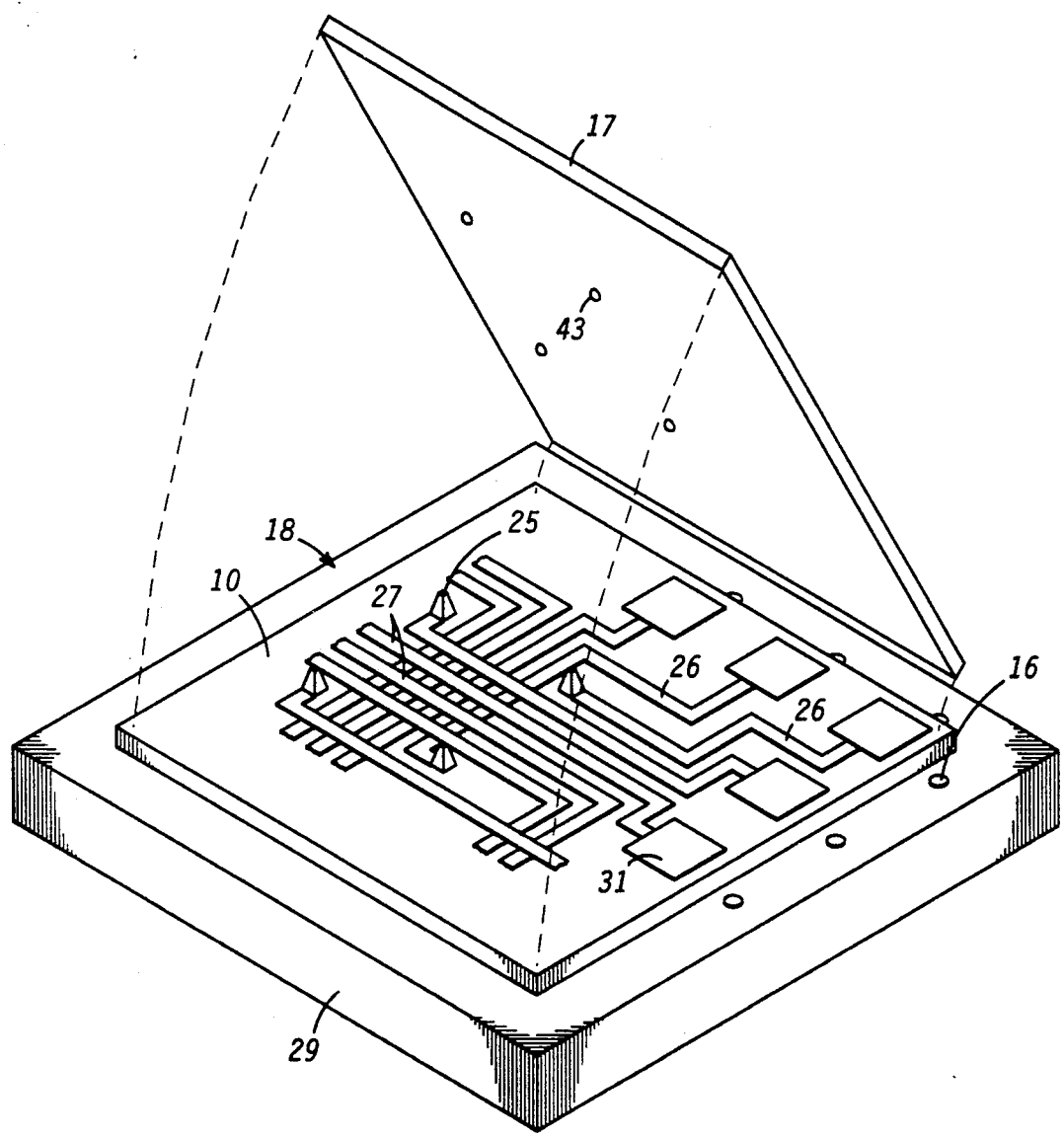
FIG. 3 is a pictorial representation of a top view of an area array probe card in accordance with the present invention.

FIG. 3 is a pictorial representation of an expanded view of a portion of probe card 18 with an array of probe tip contacts 25 configured to mate with electrode pads or bumps 43, that are patterned as an area array on an unencapsulated semiconductor device 17 to be tested. It is understood that the embodiment shown in FIG. 3 depicts an expanded view of a portion of probe card 18 and an expanded view of a portion of unencapsulated semiconductor device 17 in an area array configuration, whereas the embodiment shown in FIG. 1 depicts probe card 8 and unencapsulated semiconductor material 7 in a peripheral array configuration. Probe tip contact 25 positions are patterned using generally accepted photolithographic techniques.

Figure 4:
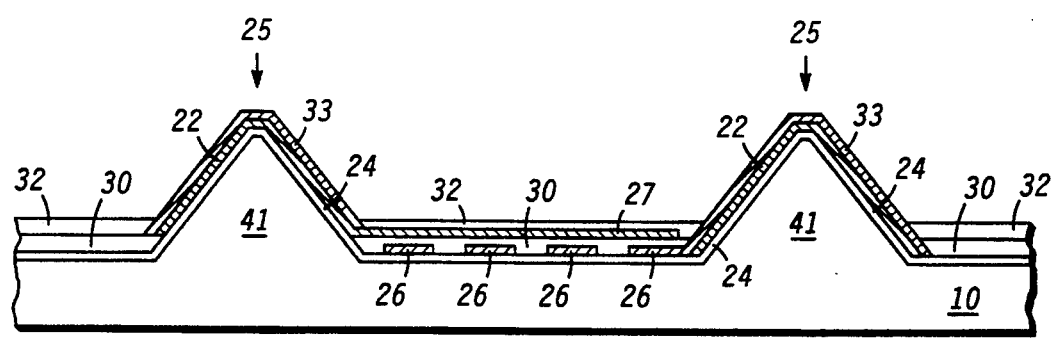
FIG. 4 is a cross-sectional side view of area array probe tips illustrated in FIG. 3.

Conductive traces 26 and 27 are in a multilayer arrangement wherein a first layer of conductive traces 26 is orthogonal to a second layer of conductive traces 27. Separating conductive traces 26 and 27 is a layer of dielectric material 30 as shown in FIG. 4. Conductive traces 26 and 27 connect probe tip contacts 25 to bond pads 31, wherein bond pads 31 are coplanar and on the surface of semiconductor material 10. Although not shown, it is understood that since bond pads 31 are coplanar, vias exist for routing conductive traces 26 and 27 to their respective bond pads 31. It is further understood that a single probe tip contact 25 is connected to a single bond pad 31 by a single conductive trace 26 or 27.

As in the architecture employing a peripheral array, semiconductor material 10 is mounted to a support structure 29 which includes a plurality of conductive pads 16. Further, in a first embodiment, support structure 29 is a pin grid array package with conductive pads 16 wire bonded to bond pads 31. In a second embodiment, pin grid array package support structure 29 is TAB bonded, to bond pads 31. In a third embodiment, support structure 29 is a pad grid array package with conductive pads 16 wire bonded to bond pads 31. In a fourth embodiment, bond pads 31 are electrically coupled to pad grid array package support structure 29 by TAB bonding. It is realized that the support structure 29 shown in FIG. 3 is a representation to encompass both pin grid array and pad grid array packages as is obvious to those skilled in the arts. Again, it will be understood that probe card 18 is illustrated as an example only and not as a limitation to the present invention. In other words, the number of probe tips, the number of conductive layers, and the shape of the probe card are not limited by the examples given. It will be understood that many bond pads 31, probe tip contacts 25, and conductive traces 26 and 27 are on semiconductor substrate material 10, and many electrode pads 43 are on unencapsulated semiconductor device 17; only a few can be seen, since these are illustrated in expanded form to better show details.

FIG. 4 is a cross-sectional side view of a portion of probe card 18 (shown in FIG. 3) wherein probe tips 41 are patterned in an area array configuration. Probe tips 41 are formed using an anisotropic or orientation dependent wet etch to etch semiconductor material 10 as described in the discussion of FIG. 2. An anisotropic etch is used to form probe tips 41 of suitable dimensions, which typically occurs when the surface of semiconductor material 10 is etched down approximately fifteen micrometers. In a preferred embodiment, semiconductor material 10 is patterned in a grid array having areas at the base of probe tips 41 of 25 micrometers by 25 micrometers. After formation of probe tips 41, a layer of dielectric material 24 is formed on the surface of semiconductor material 10 and probe tips 41. In a preferred embodiment, dielectric material 24 is silicon dioxide with a thickness of 1 micrometer for burn-in testing.

Primary conductive material 22 is deposited over some probe tips 41 coated with dielectric material 24, and is further deposited as conductive traces 26 to couple the conductor covered probe tips 41 with some bond pads 31 (shown in FIG. 3). All probe tips 41 covered by primary conductive material 22 are coated with a secondary conductive material 33. The structures comprising probe tips 41, dielectric material 24, primary conductive material 22, and secondary conductive material 33 are referred to as probe tip contacts 25.

After conductive traces 26 are formed, a layer of dielectric material 30 is deposited over dielectric material 24 and conductive traces 26, wherein dielectric material 30 surrounds conductive traces 26. Dielectric material 30 is not deposited in areas where probe tip contacts 25 or bond pads 31 (shown in FIG. 3) are located. Probe tip contacts 25, and bond pads 31 are not covered by dielectric material 30 enabling them to make electrical contact with the unencapsulated semiconductor device 17 or with conductive traces 27. In a preferred embodiment, dielectric material 30 is polyimide. In a further embodiment, the thickness of dielectric material 30 for burn-in testing is 3 micrometers.

Primary conductive material 22 is deposited over some probe tips 41 coated with dielectric material 24, and is further deposited as conductive traces 27 to couple the conductor covered probe tips 41 with some bond pads 31 (shown in FIG. 3). Probe tips 41, including dielectric material 24, not covered by primary conductive material 22 during the formation of conductive traces 26 are covered by primary conductive material 22 during the formation of conductive traces 27. Conversely, probe tips 41 covered by primary conductive material 22 during the formation of conductive traces 27 are not covered by conductive material 22 during the formation of conductive traces 26.

Probe tips 41 covered by primary conductive material 22, and further forming conductive traces 27, are each coated with a secondary conductive material 33. The metallization materials for FIG. 4 are identical to those described for FIG. 2. Hence, primary conductive material 12 and secondary conductive material 23 of FIG. 2 are the same as primary conductive material 22 and secondary conductive material 33 of FIG. 4.

Since conductive traces 26 and 27 are mutually orthogonal, FIG. 4 shows the width of a plurality of conductive traces 26 and a portion of a single conductive trace 27. In a preferred embodiment the distance between adjacent edges of two coplanar signal traces is 25 micrometers.

After formation of conductive traces 27, a layer of dielectric material 32 is deposited over dielectric material 30, and further surrounds conductive traces 27. Probe tip contacts 25 and bond pads 31 (shown in FIG. 3) are not covered by dielectric material 32, thereby allowing them to electrically contact electrode pads or bumps 23.

In an alternate metallization scheme for the area array configuration shown in FIG. 4, probe tip 41 regions are not coated with a layer of secondary conductive material 33 in the steps immediately following the formation of conductive traces 26 and 27. Rather, the coating of probe tip 41 regions with secondary conductive material 33 to form probe tip contacts 25 occurs as a final step. Hence, the processing steps for this method are similar to those of the previous technique except that coating by secondary conductive material 33 does not occur until after dielectric material 32 is deposited. After the final layer of dielectric material 32 is deposited, secondary conductive material 33 is coated over probe tip 41 regions to form probe tip contacts 25, wherein some probe tip contacts 25 electrically contact some conductive traces 26, and some probe tip contacts 25 electrically contact some other conductive traces 27.

It is understood that probe tip 41 regions are not covered until secondary conductive material 33 is deposited. Thus, electrical contact between primary conductive material 22 and secondary conductive material 33 occurs. The primary advantage of performing the metallization in this sequence is that probe tip contacts 25 can be reworked and subsequently reused.

Figure 5:
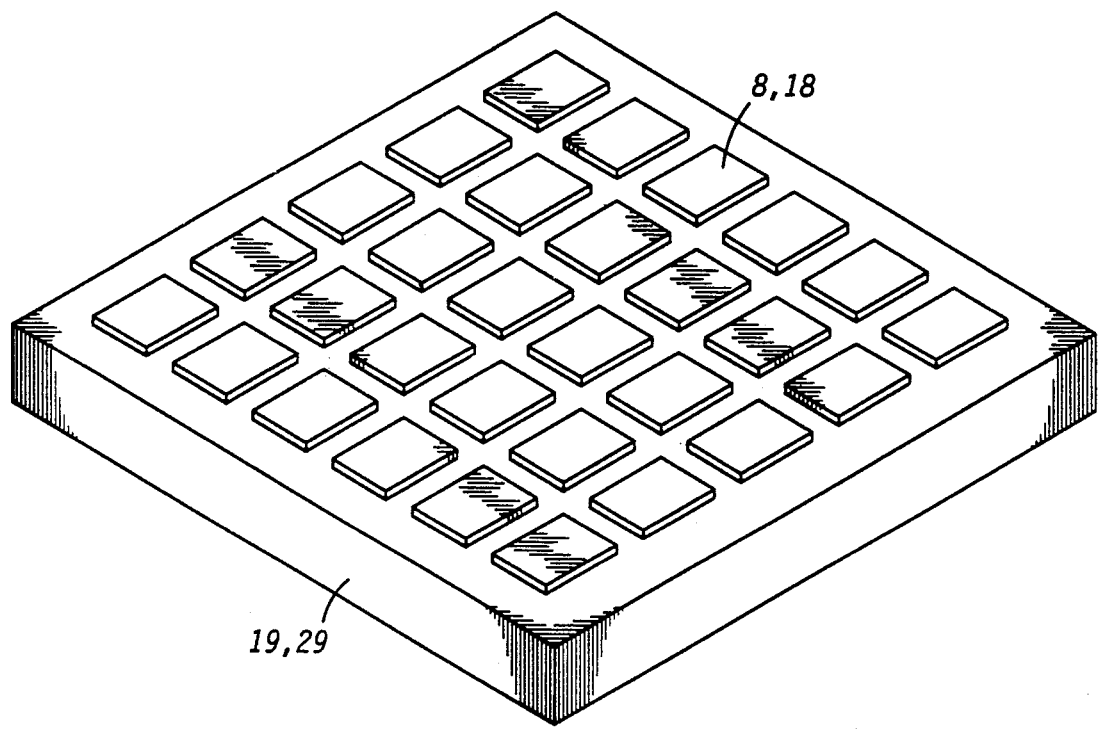
FIG. 5 is a pictorial representation of a top view of a plurality of probe cards mounted to a support structure in accordance with the present invention.

FIG. 5 is a pictorial representation of a top view of a plurality of probe cards 8, 18 mounted to a support structure 19, 29. Probe cards 8, 18 are adapted to cooperate to simultaneously test a plurality of unencapsulated semiconductor devices 7, 17 (shown in FIG. 1 and FIG. 3). The number of probe cards 8, 18 mounted to support structure 19, 29 is variable. It will be understood that probe cards 8, 18 mounted to support structure 19, 29 is illustrated as an example only and not as a limitation to the present invention. In other words, the number of probe cards, the shape of probe cards, and the layout of probe cards on the support structure are not limited by the examples given.

By now it should be appreciated that there has been provided an improved interface probe card for testing unencapsulated semiconductor devices. The probe card may be constructed from a semiconductor material similar to the substrate of the semiconductor device being tested, and is particularly useful for burn-in testing of the unencapsulated semiconductor device. The primary advantage of building the probe card from material similar to the integrated circuit is that the coefficients of thermal expansion will match.

Other advantages include shorter interconnect lengths as well as the ability to optimize probe card construction for testing in a controlled impedance environment, since the characteristic impedance of the conductive traces is controlled by trace width and dielectric thickness. Further, the probe card is manufactured using generally accepted photolithographic and etch techniques which greatly simplifies probe card construction; resulting in lower cost and shorter cycle time for probe card construction. Finally, this improved probe card allows the testing of integrated circuits having electrode pads in either a peripheral array or an area array.

We claim:

1. A probe card for testing unencapsulated semiconductor devices, comprising:
    a flat, continuous, and cavity-less semiconductor substrate;
    a plurality of protrusions formed on a top surface of the flat, continuous, and cavity-less semiconductor substrate, wherein the plurality of protrusions project from the top surface and are patterned to mate with electrode pads or bumps on the unencapsulated semiconductor device to be tested;
    a conductive material covering each of the plurality of protrusions wherein the conductive material is separated from the top surface by a layer of dielectric material;
    a conductive interconnect for externally coupling to each of the plurality of protrusions wherein the conductive interconnect is on a side of the semiconductor material having the plurality of protrusions; and
    a means for supporting the flat, continuous, and cavity-less semiconductor substrate to facilitate external coupling of the plurality of protrusions.

2. The probe card of claim 1 wherein the flat, continuous, and cavity-less semiconductor substrate comprises a semiconductor material similar to that of the unencapsulated semiconductor device to be tested.

3. The probe card of claim 1 wherein the flat, continuous, and cavity-less semiconductor substrate has a perimeter that extends beyond a perimeter of the unencapsulated semiconductor device to be tested.

4. A method of burn-in testing an unencapsulated semiconductor device, comprising:
    providing a plurality of semiconductor probe cards adapted to cooperate to simultaneously burn-in test a plurality of unencapulated semiconductor devices, the semiconductor probe cards comprising a semiconductor substrate having an array of probe tips etched on a top surface of the semiconductor substrate, wherein a layer of dielectric material is formed on a top surface of the semiconductor substrate;
    providing a semiconductor device having an array of electrode pads wherein the array of electrode pads corresponds to the array of probe tips;
    placing the semiconductor device to be tested in contact with the probe card wherein the array of probe tips are in temporary contact with the corresponding array of electrode pads; and
    performing the burn-in test of the circuit.

* * * * *

UNITED STATES PATENT AND TRADEMARK OFFICE
CERTIFICATE OF CORRECTION

PATENT NO. : 5,177,439

DATED : January 5, 1993

INVENTOR(S) : Jui-Hsian Liu et al

It is certified that error appears in the above-identified patent and that said Letters Patent is hereby corrected as shown below:

On the title page, Item [73]:
Please change Assignee from "U.S. Philips Corporation, New York, N.Y." to --Motorola Inc., Schaumburg, Illinois--.

Please change Attorney from "Robert J. Kraus" to --Joe E. Barbee--.

Signed and Sealed this

Second Day of November, 1993

Attest:

BRUCE LEHMAN

*Attesting Officer*  *Commissioner of Patents and Trademarks*